(12) United States Patent
Cheng

(10) Patent No.: US 12,160,134 B2
(45) Date of Patent: Dec. 3, 2024

(54) POWER SOURCE COMBINATION CIRCUIT, DIAGNOSIS METHOD AND APPARATUS, AND SYSTEM

(71) Applicant: Huawei Technologies Co., Ltd., Shenzhen (CN)

(72) Inventor: Jia Cheng, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 1 day.

(21) Appl. No.: 17/948,341

(22) Filed: Sep. 20, 2022

(65) Prior Publication Data

US 2023/0015317 A1    Jan. 19, 2023

Related U.S. Application Data

(63) Continuation of application No. PCT/CN2021/079318, filed on Mar. 5, 2021.

(30) Foreign Application Priority Data

Mar. 20, 2020   (CN) .................. 202010203132.X

(51) Int. Cl.
| | |
|---|---|
| H02J 9/06 | (2006.01) |
| G01R 31/28 | (2006.01) |
| G01R 31/40 | (2020.01) |
| H02J 1/10 | (2006.01) |

(52) U.S. Cl.
CPC ............ *H02J 9/06* (2013.01); *G01R 31/2836* (2013.01); *G01R 31/40* (2013.01); *H02J 1/10* (2013.01); *H02J 9/061* (2013.01)

(58) Field of Classification Search
CPC ... H02J 1/10; H02J 1/108; H02J 9/061; G01R 19/16538; G01R 31/2836; G01R 31/40
See application file for complete search history.

(56) References Cited

U.S. PATENT DOCUMENTS

| | | | |
|---|---|---|---|
| 2007/0108991 A1 | 5/2007 | Ball | |
| 2016/0274195 A1* | 9/2016 | Collins | .................. G01R 31/40 |

FOREIGN PATENT DOCUMENTS

| | | | |
|---|---|---|---|
| CN | 101226414 A | | 7/2008 |
| CN | 101728866 A | | 6/2010 |
| CN | 101958576 A | | 1/2011 |
| CN | 102375128 A | * | 3/2012 |
| CN | 103219790 A | | 7/2013 |
| CN | 106848998 A | | 6/2017 |

(Continued)

*Primary Examiner* — Ryan Johnson
(74) *Attorney, Agent, or Firm* — Conley Rose, P.C.

(57) ABSTRACT

A power source combination circuit has a combination circuit and a controller. The combination circuit includes a first power source, a first field-effect transistor, a second power source, and a second field-effect transistor. The controller is configured to control the combination circuit to supply power to a load circuit, obtain a first input voltage, a second input voltage, and a third input voltage, and diagnose, based on the obtained voltages, whether the combination circuit is in a normal state or an abnormal state. The first input voltage is an input side voltage of the first field-effect transistor, the second input voltage is an input side voltage of the second field-effect transistor, and the third input voltage is a voltage at a power source input end of the load circuit.

20 Claims, 6 Drawing Sheets

(56) References Cited

FOREIGN PATENT DOCUMENTS

| | | | |
|---|---|---|---|
| CN | 109660364 | A | 4/2019 |
| CN | 109787348 | A | 5/2019 |
| JP | 2009189126 | A | 8/2009 |

* cited by examiner

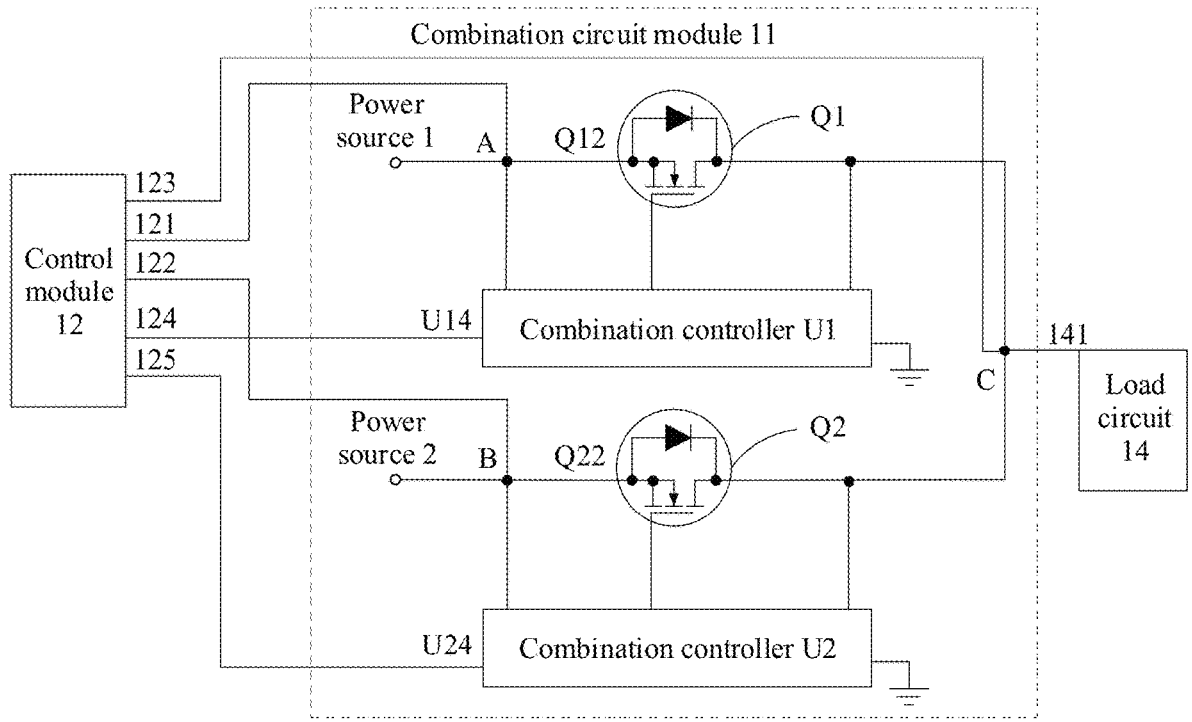

FIG. 8

| A control module 12 sends a control signal to a combination circuit module 11, so as to control and obtain a state combination of field-effect transistors in the combination circuit module 11 | S101 |

| The control module 12 obtains a first input voltage, a second input voltage, and a third input voltage of the field-effects transistor that are in the combination circuit module 11 and that are in different state combinations | S102 |

| The control module 12 diagnoses the combination circuit module 11 based on the first input voltage, the second input voltage, the third input voltage, and a preset parameter of the field-effect transistors that are in the combination circuit module 11 and that are in the different state combinations | S103 |

FIG. 9 though the field-effect transistor is relatively large, the field-effect transistor may not generate excessive heat loss. That is, the power source combination circuit is configured to supply power to multiple (for example, two) power sources for a low-voltage load circuit whose power is relatively high.

POWER SOURCE COMBINATION CIRCUIT, DIAGNOSIS METHOD AND APPARATUS, AND SYSTEM

CROSS-REFERENCE TO RELATED APPLICATIONS

This is a continuation of International Patent Application No. PCT/CN2021/079318 filed on Mar. 5, 2021, which claims priority to Chinese Patent Application No. 202010203132.X filed on Mar. 20, 2020. The disclosures of the aforementioned applications are hereby incorporated by reference in their entireties.

TECHNICAL FIELD

The disclosure relates to the technical field of power sources, and in particular to a power source combination circuit, a diagnosis method and apparatus, and a system.

BACKGROUND

To ensure reliable power consumption of a circuit system (for example, a multi-functional electronic control unit (ECU)), dual power sources are usually used to supply power to the circuit system. To supply power via dual power sources, a power source combination circuit is developed.

An existing power source combination circuit is generally used to supply power to a low-voltage circuit system with relatively low power, and fails to diagnose a faulty (for example, short-circuited or open-circuited) component in the power source combination circuit, reducing security of the low-voltage circuit system.

SUMMARY

This disclosure provides a power source combination circuit, a diagnosis method and apparatus, and a system that diagnose a faulty component in a power source combination circuit, to improve security of a load circuit system.

According to a first aspect, this disclosure provides a power source combination circuit that is used in a power source combination circuit system. The power source combination circuit includes a combination circuit module and a control module. The combination circuit module includes a first power source, a first field-effect transistor, a second power source, and a second field-effect transistor. The first power source is connected to an input end of the first field-effect transistor, the second power source is connected to an input end of the second field-effect transistor, and output ends of the first field-effect transistor and the second field-effect transistor are both connected to a power source input end of a load circuit. The control module is configured to control the combination circuit module to supply power to the load circuit, and obtain a first input voltage, a second input voltage, and a third input voltage. The control module is further configured to diagnose, based on the obtained voltages, whether the combination circuit module is abnormal. The first input voltage is an input side voltage of the first field-effect transistor, the second input voltage is an input side voltage of the second field-effect transistor, and the third input voltage is a voltage at the power source input end of the load circuit.

By using the power source combination circuit, the control module diagnoses the power source combination circuit before supplying power to the load circuit, thereby improving usage safety of the load circuit. In addition, the power source combination circuit uses a field-effect transistor as a key component. Because a voltage drop of a field-effect transistor is extremely small (in millivolts) when the field-effect transistor is in an on state, even if a current flowing through the field-effect transistor is relatively large, the field-effect transistor may not generate excessive heat loss. That is, the power source combination circuit is configured to supply power to multiple (for example, two) power sources for a low-voltage load circuit whose power is relatively high.

In a possible design manner, the control module is further configured to diagnose, based on the obtained voltages and a preset parameter, whether the combination circuit module is abnormal. In this case, the preset parameter includes at least one of the following values: a minimum forward voltage drop value of an internal body diode of the first field-effect transistor, a maximum forward voltage drop value of the internal body diode of the first field-effect transistor, a minimum forward voltage drop value of an internal body diode of the second field-effect transistor, a maximum forward voltage drop value of the internal body diode of the second field-effect transistor, a maximum voltage difference value that is calculated on the basis of a maximum current of the load circuit and that is of the first field-effect transistor, or a maximum voltage difference value that is calculated on the basis of the maximum current of the load circuit and that is of the second field-effect transistor.

On the basis of the obtained first input voltage, second input voltage, third input voltage, and a preset parameter, the power source combination circuit is diagnosed.

In another possible design manner, the power source combination circuit further includes a sampling module. The sampling module is connected to the input end of the first field-effect transistor, the input end of the second field-effect transistor, and the power source input end of the load circuit. The sampling module is configured to collect a first input voltage, a second input voltage, and a third input voltage. The control module is further configured to obtain the first input voltage, the second input voltage, and the third input voltage that are collected by the sampling module. In this way, by collecting the first input voltage, the second input voltage, and the third input voltage, the control module diagnoses the power source combination circuit.

In another possible design manner, the control module is further configured to control statuses of the first field-effect transistor and the second field-effect transistor, where the statuses include an on state and a cut-off state. The control module is further configured to obtain a first input voltage, a second input voltage, and a third input voltage that are collected by the sampling module when the first field-effect transistor and the second field effect are in a target state combination. The target state combination includes any one of the following combinations: the first field-effect transistor and the second field-effect transistor are both in an on state, the first field-effect transistor and the second field-effect transistor are both in a cut-off state, the first field-effect transistor is in an on state, and the second field-effect transistor is in a cut-off state, and the first field-effect transistor is in a cut-off state, and the second field-effect transistor is in an on state.

The control module detects the first input voltage, the second input voltage, and the third input voltage when the first field-effect transistor corresponding to the first power source and the second field-effect transistor corresponding to the second power source are in different state combinations, and determines whether values of the first input voltage, the second input voltage, and the third input voltage are within a theoretical range in each state combination, so as to diagnose a failure of a component in the combination circuit module.

In another possible design manner, the combination circuit module further includes a first combination controller and a second combination controller. The first combination controller is connected to an excitation end of the first field-effect transistor, and the second combination controller is connected to an excitation end of the second field-effect transistor. The control module is further configured to control the first combination controller to output a first excitation voltage. The first excitation voltage is used to control the first field-effect transistor to be in an on state. The control module is further configured to control the second combination controller to output a second excitation voltage. The second excitation voltage is used to control the second field-effect transistor to be in an on state.

In another possible design manner, the control module is further configured to, when the combination circuit module is diagnosed as normal, control both the first field-effect transistor and the second field-effect transistor to be in an on state, so as to control the combination circuit module to supply power to the load circuit, and when the combination circuit module is diagnosed as abnormal, output an alarm signal. In this possible design manner, when a component in the power source combination circuit is diagnosed as abnormal, an alarm signal is output to prompt a user to stop powering on the load circuit, so as to ensure that a fault due to the abnormality of the power source combination circuit is absent from the load circuit during a power supply process, thereby improving usage safety of the load circuit.

In another possible design manner, power of the control module is less than or equal to a preset threshold, and power of the load circuit is greater than or equal to the preset threshold.

According to a second aspect, this disclosure provides a diagnosis method for a power source combination circuit. The method is applied to a power source combination circuit system. The power source combination circuit system includes the power source combination circuit. The power source combination circuit consists of a combination circuit module and a control module. The combination circuit module contains a first power source, a first field-effect transistor, a second power source, and a second field-effect transistor. Herein, the first power source is connected to an input end of the first field-effect transistor, the second power source is connected to an input end of the second field-effect transistor, and both an output end of the first field-effect transistor and an output end of the second field-effect transistor are connected to a power source port of a load circuit. The control module is configured to control the combination circuit module to supply power to the load circuit. The method is executed by the control module. The method includes obtaining a first input voltage, a second input voltage, and a third input voltage. The first input voltage is an input side voltage of the first field-effect transistor, the second input voltage is an input side voltage of the second field-effect transistor, and the third input voltage is a voltage at a power source end of the load circuit. The method further includes diagnosing, based on the obtained voltages, whether the combination circuit module is abnormal.

In a possible design manner, the "diagnosing, based on the obtained voltages, whether the combination circuit module is abnormal" includes diagnosing, based on the obtained voltages and a preset parameter, whether the combination circuit module is abnormal. In this case, the preset parameter includes at least one of the following values: a minimum forward voltage drop value of an internal body diode of the first field-effect transistor, a maximum forward voltage drop value of the internal body diode of the first field-effect transistor, a minimum forward voltage drop value of an internal body diode of the second field-effect transistor, a maximum forward voltage drop value of the internal body diode of the second field-effect transistor, a maximum voltage difference value that is calculated on the basis of a maximum current of the load circuit and that is of the first field-effect transistor, or a maximum voltage difference value that is calculated on the basis of the maximum current of the load circuit and that is of the second field-effect transistor.

In another possible design manner, the power source combination circuit further includes a sampling module. The sampling module is connected to the input end of the first field-effect transistor, the input end of the second field-effect transistor, and the power source input end of the load circuit. The sampling module is configured to collect a first input voltage, a second input voltage, and a third input voltage. Obtaining a first input voltage, a second input voltage, and a third input voltage includes obtaining the first input voltage, the second input voltage, and the third input voltage that are collected by the sampling module.

In another possible design manner, the method further includes controlling statuses of the first field-effect transistor and the second field-effect transistor. The statuses include an on state and a cut-off state. Obtaining the first input voltage, the second input voltage, and the third input voltage that are collected by the sampling module includes obtaining a first input voltage, a second input voltage, and a third input voltage that are collected by the sampling module when the first field-effect transistor and the second field-effect transistor are in a target state combination. The target state combination includes any one of the following combinations: the first field-effect transistor and the second field-effect transistor are both in an on state, the first field-effect transistor and the second field-effect transistor are both in a cut-off state, the first field-effect transistor is in an on state, and the second field-effect transistor is in a cut-off state, and the first field-effect transistor is in a cut-off state, and the second field-effect transistor is in an on state.

In another possible design manner, the combination circuit module further includes a first combination controller and a second combination controller, where the first combination controller is connected to an excitation end of the first field-effect transistor, and the second combination controller is connected to an excitation end of the second field-effect transistor. Controlling statuses of the first field-effect transistor and the second field-effect transistor include controlling the first combination controller to output a first excitation voltage, where the first excitation voltage is used to control the first field-effect transistor to be in an on state, and controlling the second combination controller to output a second excitation voltage, where the second excitation voltage is used to control the second field-effect transistor to be in an on state.

In another possible design manner, the method further includes, when the combination circuit module is diagnosed as normal, controlling both the first field-effect transistor and the second field-effect transistor to be in an on state, so as to control the combination circuit module to supply power to the load circuit. When the combination circuit module is diagnosed as abnormal, an alarm signal is output.

In another possible design manner, power of the control module is less than or equal to a preset threshold, and power of the load circuit is greater than or equal to the preset threshold.

It may be understood that, for descriptions of beneficial effects of the second aspect and any possible technical solution of the second aspect, refer to the technical solution provided in the first aspect or the corresponding possible design of the first aspect. Details are not described herein again.

According to a third aspect, an embodiment of this disclosure provides a diagnosis apparatus for a power source combination circuit. The diagnosis apparatus is used in the power source combination circuit in a power source combination circuit system.

In a possible design, the diagnosis apparatus is configured to perform any method according to the second aspect and any possible design of the second aspect. In this disclosure, functional module division may be performed on the diagnosis apparatus according to any method provided in the second aspect. For example, each functional module may be divided for each function, or two or more functions may be integrated into one processing module. For example, in this disclosure, the diagnosis apparatus may be divided into an obtaining unit, a diagnosis unit, a control unit, and the like based on functions. For descriptions of possible technical solutions performed by the functional modules obtained through division and beneficial effects achieved by the functional modules, refer to the technical solutions provided in the second aspect or the corresponding possible designs of the second aspect. Details are not described herein again.

In another possible design, the diagnosis apparatus includes a memory and one or more processors, and the memory is coupled to the processor. The memory is configured to store a computer instruction, and the processor is configured to invoke the computer instruction, to perform any method according the second aspect and any possible design manner of the second aspect.

According to a fourth aspect, this disclosure provides a power source combination circuit system. The power source combination circuit system includes a load circuit, and a power source combination circuit provided in the first aspect and any possible design manner of the first aspect. The power source combination circuit is configured to supply power to the load circuit.

According to a fifth aspect, this disclosure provides a computer-readable storage medium, for example, a non-transitory computer-readable storage medium. The computer-readable storage medium stores a computer program (or instruction). When the computer program (or instruction) is run on a diagnosis apparatus for a power source combination circuit, the diagnosis apparatus is enabled to perform any method provided in any possible implementation according to the second aspect.

According to a sixth aspect, a computer program product is provided. When the computer program product is run on a diagnosis apparatus for a power source combination circuit, any method provided in any possible implementation according to the second aspect is performed.

According to a seventh aspect, a chip system is provided and includes a processor. The processor is configured to invoke, from a memory, a computer program stored in the memory and run the computer program, to perform any method provided in the implementations according to the second aspect.

It may be understood that any method, apparatus, computer storage medium, computer program product, chip system, or the like provided above may be used in the corresponding method provided above. Therefore, for beneficial effects that may be achieved, refer to beneficial effects of the corresponding method. Details are not described herein again.

In this disclosure, on the basis of the implementations according to the foregoing aspects, the implementations may be further combined to provide more implementations.

BRIEF DESCRIPTION OF DRAWINGS

FIG. 8 is a schematic diagram of still another power source combination circuit system according to an embodiment of this disclosure;

FIG. 9 is a schematic flowchart of a power source combination circuit diagnosis method according to an embodiment of this disclosure.

DESCRIPTION OF EMBODIMENTS

Embodiments of this disclosure provide a power source combination circuit and a system. This resolves a problem of a high heat loss of the power source combination circuit when at least two power sources are provided to supply power to a load circuit whose power is relatively high. In addition, this disclosure further provides a power source combination circuit diagnosis method and an apparatus. The method is applied to a power source combination circuit system. The method may diagnose a faulty component of the power source combination circuit when the power source combination circuit system is powered on. When the diagnosis result is abnormal, an alarm is sent to a user.

The load circuit may be a circuit system with any function. For example, it may be an ECU implementing a plurality of functions, such as a vehicle controller unit (VCU), an electronic stability program (ESP), and an advanced driving assistant system (ADAS) in an electric vehicle control system. Herein, the VCU and the ESP are ECUs with relatively low power (for example, power lower than 100 watts (W)). The ADAS with a relatively high automated driving level (for example, a level above level 3 (L3) or level 4 (L4)) is an ECU with relatively high power (for example, power higher than 100 W).

In the following descriptions, an example where the power source combination circuit provides a dual power source to supply power to the load circuit is used for description in this embodiment of this disclosure.

Figure 1:
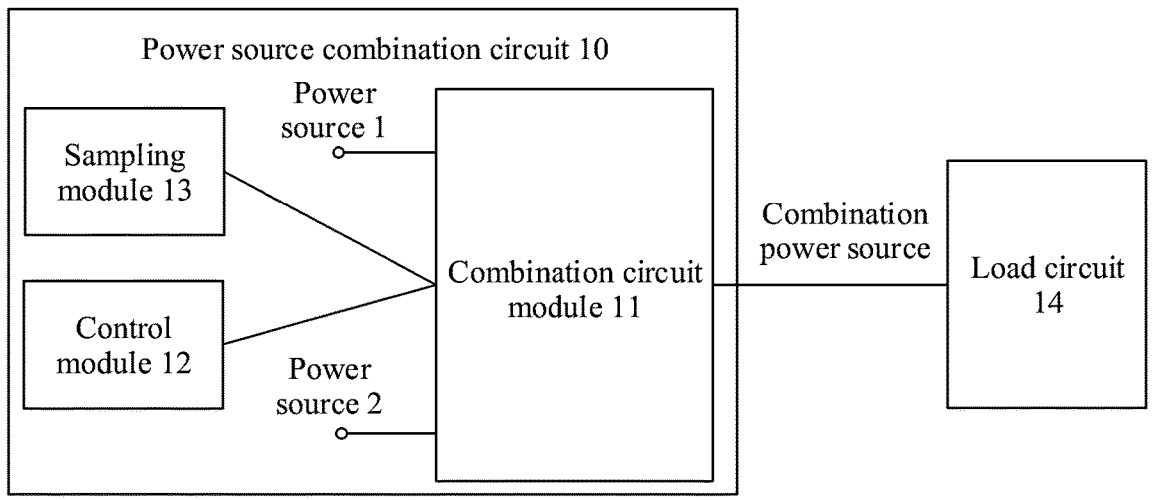
FIG. 1 is a schematic diagram of a power source combination circuit according to an embodiment of this disclosure.

FIG. 1 shows a power source combination circuit 10 according to an embodiment of this disclosure. The power source combination circuit 10 is configured to combine two power sources (for example, a power source 1 and a power source 2) into one power source (that is, a combination power source), to supply power to a load circuit 14. The power source combination circuit 10 includes a combination circuit module 11, a control module 12, and a sampling module 13.

The combination circuit module 11 is configured to provide the combination circuit of two power sources. The control module 12 is configured to diagnose the combination circuit module 11 when the power source combination circuit system is powered on. In addition, when the diagnosis result is normal, the combination circuit module 11 is controlled to provide a dual power source to supply power to the load circuit. The control module 12 may implement a function of the control module 12 via a micro controller unit (MCU), or may implement a function of the control module 12 through an ECU that has a specific function. This is not limited. The sampling module 13 is configured to collect an input side voltage of the combination circuit module 11 and an input voltage of the load circuit, so that the control module 12 may diagnose the combination circuit module 11 based on the collected voltages.

It should be noted that the sampling module 13 and the control module 12 may exist independently, or may be integrated together. This is not limited. For a brief description, an example where the control module 12 and the sampling module 13 are integrated is used for description in this embodiment of this disclosure. It may be understood that the control module 12 described below includes the sampling module 13.

Figure 2:
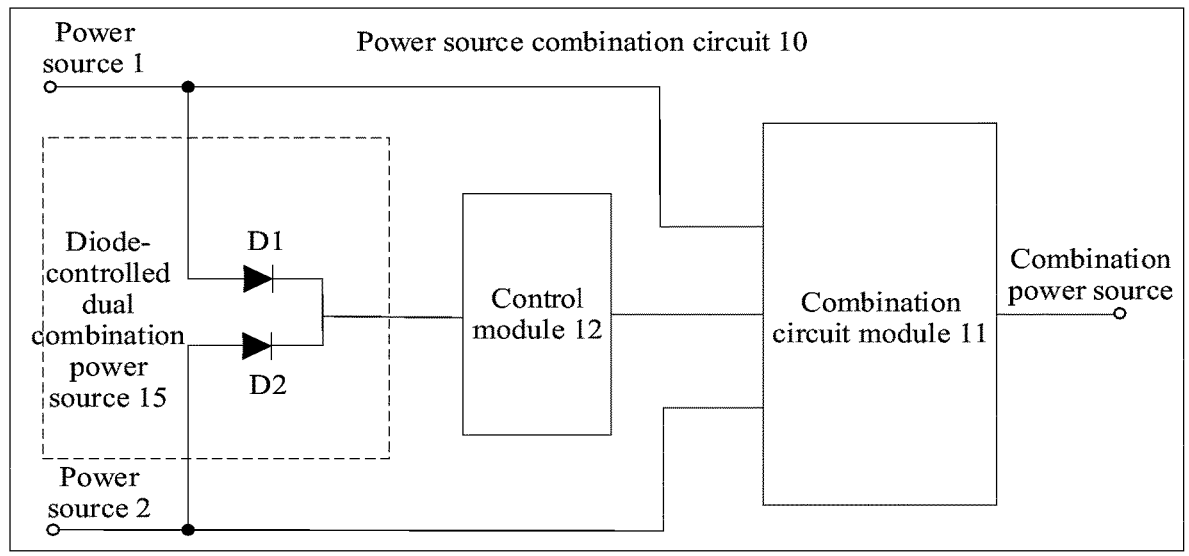
FIG. 2 is a schematic diagram of another power source combination circuit according to an embodiment of this disclosure.

It should be noted that the control module 12 needs to be powered independently to ensure that the control module 12 works properly. In order to achieve more reliable power supply, the dual combination power source 15 controlled by the diodes (for example, a D1 and a D2) shown in FIG. 2 is generally configured to supply power to the control module 12. As shown in FIG. 2, a power source 1 is connected to the diode D1, and a power source 2 is connected to the diode D2. Both D1 and D2 are connected to a power source input end of the control module 12, so that the dual combination power source is provided to supply power to the control module 12.

The power source 1 and the power source 2 shown in FIG. 2 are respectively the power source 1 and the power source 2 connected to the combination circuit module 11 in FIG. 1. Due to an inherent voltage drop of a diode, the dual combination power source 15 controlled by the diodes fails to bear a low-voltage (for example, a voltage lower than 48 volt (V)) load circuit with relatively high power (for example, power higher than 100 W). That is, an MCU or an ECU that implements a function of the control module 12 is generally an MCU or an ECU with relatively low power. For example, the ECU may be the VCU. The power source combination circuit 10 provided in this embodiment of this disclosure shown in FIG. 1 may provide a dual power source to supply power to the low-voltage load circuit with relatively high power. For details, refer to the following description. Details are not described herein again.

An embodiment of this disclosure further provides a power source combination circuit system. The power source combination circuit 10 may be used in the power source combination circuit system. The power source combination circuit system further includes a load circuit 14. The power source combination circuit 10 is configured to provide a dual power source to supply power to the load circuit.

In a possible implementation, refer to FIG. 1. The power source combination circuit 10 may be used as an independent electronic unit to supply power to any load circuit 14 via a dual power source. For example, the load circuit 14 may be an ECU with any foregoing function in an electric vehicle. In this case, the control module 12 in the power source combination circuit 10 may be an independent MCU.

Figure 3:
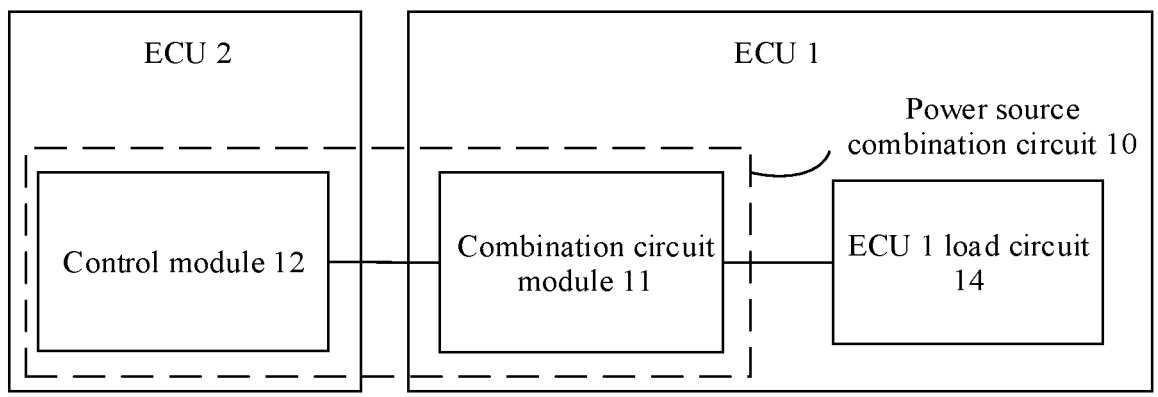
FIG. 3 is a schematic diagram of a power source combination circuit system according to an embodiment of this disclosure.

In another possible implementation, the combination circuit module 11 and the control module 12 in the power source combination circuit 10 may be separately integrated into different circuit systems, and provide a dual power source to supply power to the circuit system that integrates the combination circuit module 11. For example, the different circuit systems may be different ECUs. As shown in FIG. 3, the combination circuit module 11 may be integrated into an ECU 1, and the control module 12 may be integrated into an ECU 2. The control module 12 in the ECU 2 controls the combination circuit module 11 in the ECU 1, thereby providing a dual power source for a load circuit (corresponding to the load circuit 14) of the ECU 1. The ECU 1 may be the ADAS, and the ECU 2 may be the VCU. This is not limited herein.

Figure 4:
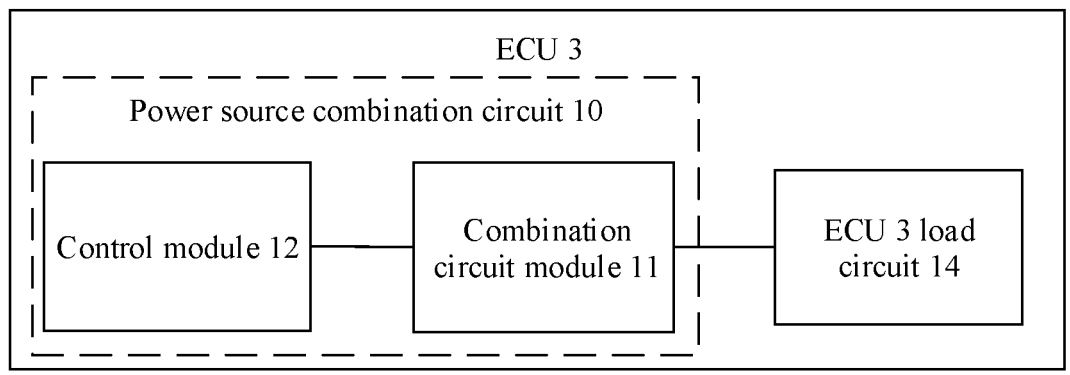
FIG. 4 is a schematic diagram of another power source combination circuit system according to an embodiment of this disclosure.

In still another possible implementation, the combination circuit module 11 and the control module 12 in the power source combination circuit 10 may alternatively be integrated into a same circuit system, and provide a dual power source to supply power to the circuit system. For example, the circuit system may be an ECU. As shown in FIG. 4, both the combination circuit module 11 and the control module 12 may be integrated into an ECU 3, and serve as a power source circuit of a load circuit (corresponding to the load circuit 14) of the ECU 3 to provide a dual power source for the load circuit. In this case, the control module 12 may implement a function of the control module 12 through an MCU integrated into the ECU 3.

The following describes in detail the combination circuit module 11 and the control module 12 in the power source combination circuit 10 shown in FIG. 1.

Figure 5:
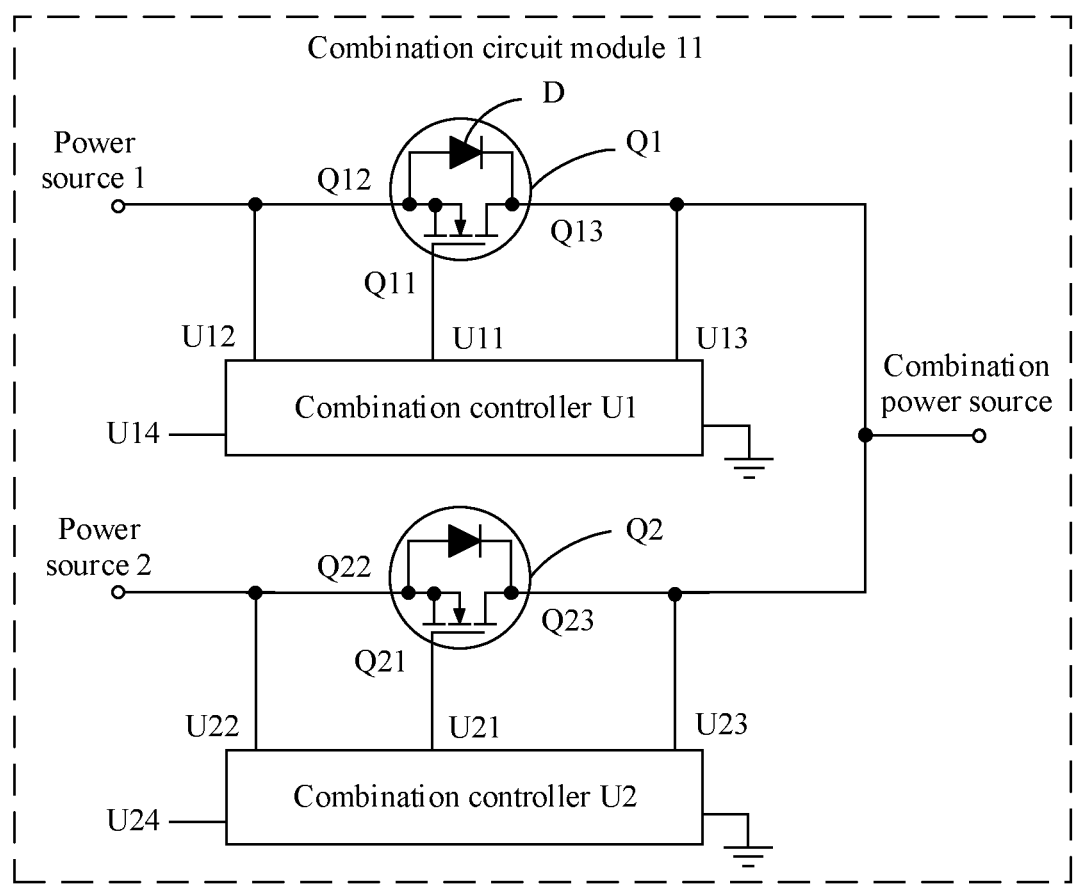
FIG. 5 is a schematic diagram of a combination circuit module according to an embodiment of this disclosure.

FIG. 5 shows a combination circuit module 11 according to an embodiment of this disclosure. The combination circuit module 11 includes a field-effect transistor Q1, a combination controller U1, a field-effect transistor Q2, and a combination controller U2. Both the Q1 and the Q2 are N-channel field-effect transistors. In addition, the Q1 corresponds to the combination controller U1, and the Q2 corresponds to the combination controller U2.

The Q1 includes an on state and a cut-off state. When the Q1 is in an on state, the internal resistance of the Q1 is very small (for example, at a milliohm level). In this way, even if a current passing through the Q1 is relatively large, the Q1 may not generate excessive heat. In this way, a load circuit connected to the Q1 may be a low-voltage load circuit with high power. When the Q1 is in a cut-off state, the Q1 does not conduct a current. Similarly, the Q2 also includes an on state and a cut-off state. For related descriptions of the Q2, refer to the descriptions of the Q1. Details are not described again.

It should be noted that both the Q1 and the Q2 in the power source combination circuit 10 may be P-channel field-effect transistors. Alternatively, one of the Q1 and the Q2 is an N-channel field-effect transistor, and the other is a P-channel field-effect transistor. This is not limited in this embodiment of this disclosure. In FIG. 5, only an example, where both the Q1 and the Q2 are N-channel field-effect transistors, is used for description.

As shown in FIG. 5, a first end Q11 (corresponding to an excitation end of a first field-effect transistor in this embodiment of this disclosure) of the Q1 may be connected to an excitation port U11 of the combination controller U1. When an enable end U14 of the combination controller U1 is activated, the combination controller U1 is in a working state. In this case, the combination controller U1 may input a first excitation voltage to the first end Q11 of the Q1 by using the excitation port U11, to excite the Q1 to be in an on state. When the enable end U14 of the combination controller U1 is turned off, the combination controller U1 is in a non-working state. In this case, the Q1 is in a cut-off state. Herein, the first end Q11 of the Q1 may be a gate electrode, and a voltage value of the first excitation voltage needs to be greater than or equal to a critical voltage value that enables the Q1 to be in an on state. The enable end U14 of the combination controller U1 may be activated or turned off through a control signal sent by the control module 12. For detailed descriptions, refer to the following descriptions of the control module 12. Details are not described herein again.

Similarly, a first end Q21 of the Q2 (corresponding to an excitation end of a second field-effect transistor in this embodiment of this disclosure) may be connected to an excitation port U21 of the combination controller U2. When an enable end U24 of the combination controller U2 is activated, the combination controller U2 is in a working state. In this case, the combination controller U2 may input a second excitation voltage to the first end Q21 of the Q2 through the excitation port U21, to excite the Q2 to be in an on state. When the enable end U24 of the combination controller U2 is turned off, the combination controller U2 is in a non-working state. In this case, the Q2 is in a cut-off state. The first end Q21 of the Q2 may be a gate electrode, and a voltage value of the second excitation voltage needs to be greater than or equal to a critical voltage value that enables the Q2 to be in an on state. The enable end U24 of the combination controller U2 may be activated or turned off through a control signal sent by the control module 12. For detailed descriptions, refer to the following descriptions of the control module 12. Details are not described herein again.

Refer to FIG. 5. A second end Q12 (corresponding to an input end of the first field-effect transistor in this embodiment of this disclosure) of the Q1 may be connected to a power source 1, and the second end Q12 of the Q1 may be a source electrode. It may be understood that a voltage stabilizer, a fuse, or another component (not shown in FIG. 5) may be further included between the second end Q12 of the Q1 and the power source 1.

Similarly, a second end Q22 (corresponding to an input end of the second field-effect transistor in this embodiment of this disclosure) of the Q2 may be connected to a power source 2, and the second end Q22 of the Q2 may be a source electrode. It may be understood that a voltage stabilizer, a fuse, or another component (not shown in FIG. 5) may be further included between the second end Q22 of the Q2 and the power source 2.

It should be noted that, if both the Q1 and the Q2 are P-channel field-effect transistors, both the second end Q12 of the Q1 and the second end Q22 of the Q2 may be a drain. In this case, a drain of the Q1 is connected to the power source 1, and a drain of the Q2 is connected to the power source 2.

As shown in FIG. 5, the second end Q12 of the Q1 may further be connected to a port U12 of the combination controller U1. That is, the power source 1 is connected to the port U12 of the combination controller U1. In this way, the power source 1 may be used as a power source of the combination controller U1, so that the combination controller U1 is in a power-on standby state. When the enable end U14 of the combination controller U1 is activated, the combination controller U1 may further collect a first input voltage at the second end Q12 of the Q1 by using the port U12. The first input voltage is an input side voltage of the Q1.

As shown in FIG. 5, a third end Q13 (corresponding to an output end of the first field-effect transistor in this embodiment of this disclosure) of the Q1 may be connected to a port U13 of the combination controller U1. When the enable end U14 of the combination controller U1 is activated, the combination controller U1 may collect a first output voltage at the third end Q13 of the Q1 through the port U13. The first output voltage is an output side voltage of the Q1. When the Q1 is in an on state, if the first input voltage collected by the combination controller U1 is lower than the first output voltage, the combination controller U1 controls a voltage output by the excitation port U11 to be lower than the first excitation voltage. Alternatively, the combination controller U1 controls the excitation port U11 to stop outputting a voltage, so that the Q1 is in a cut-off state. In this way, a current is prevented from flowing back to the power source 1.

Similarly, as shown in FIG. 5, the second end Q22 of the Q2 may further be connected to a port U22 of the combination controller U2. That is, the power source 2 is connected to the port U22 of the combination controller U2. In this way, the power source 2 may be used as a power source of the combination controller U2, so that the combination controller U2 is in a power-on standby state. When the enable end U24 of the combination controller U2 is activated, the combination controller U2 may further collect a second input voltage of the second end Q22 of the Q2 by using the port U22. The second input voltage is an input side voltage of the Q2.

A third end Q23 (corresponding to an output end of the second field-effect transistor in this embodiment of this disclosure) of the Q2 may be connected to a port U23 of the combination controller U2. When the enable end U24 of the combination controller U2 is activated, the combination controller U2 may collect a second output voltage of the third end Q23 of the Q2 through the port U23. The second output voltage is an output side voltage of the Q2. When the Q2 is in an on state, if the second input voltage collected by the combination controller U2 is lower than the second output voltage, the combination controller U2 controls a voltage output by the excitation port U21 to be lower than the second excitation voltage. Alternatively, the combination controller U2 controls the excitation port U21 to stop outputting a voltage, so that the Q2 is in a cut-off state. In this way, a current is prevented from flowing back to the power source 2.

As shown in FIG. 5, both a third end Q13 of the Q1 and the third end Q23 of the Q2 may be connected to a load circuit (not shown in FIG. 5), so as to serve as a combined power source to supply power to the load circuit. Both the third end Q13 of the Q1 and the third end Q23 of the Q2 are drains.

It may be understood that, when both the Q1 and the Q2 are P-channel field-effect transistors, both the third end Q13 of the Q1 and the third end Q23 of the Q2 may be source electrodes. That is, a source electrode of the Q1 and a source electrode of the Q2 are separately connected to the load circuit, so as to serve as a combined power source to supply power to the load circuit.

When the Q1 is an N-channel field-effect transistor, the third end Q13 of the Q1 is a drain. When the Q2 is a P-channel field-effect transistor, the third end Q23 of the Q2 is a source electrode. In this case, a drain of the Q1 and a source electrode of the Q2 are separately connected to the load circuit, so as to serve as a combined power source to supply power to the load circuit.

When the Q1 is a P-channel field-effect transistor, the third end Q13 of the Q1 is a source electrode. When the Q2 is an N-channel field-effect transistor, the third end Q23 of the Q2 is a drain. In this case, a source electrode of the Q1 and a drain of the Q2 are separately connected to the load circuit, so as to serve as a combined power source to supply power to the load circuit.

It can be seen that, for a field-effect transistor (for example, the Q1 or the Q2) in a power source combination circuit, it needs to be ensured that a positive electrode (D shown in FIG. 5) of an internal body diode of the field-effect transistor is connected to a power source. That is, it is ensured that when a field-effect transistor is in an on state, a flow direction of a current in the field-effect transistor is from a positive electrode to a negative electrode of an internal body diode D.

Figure 6:
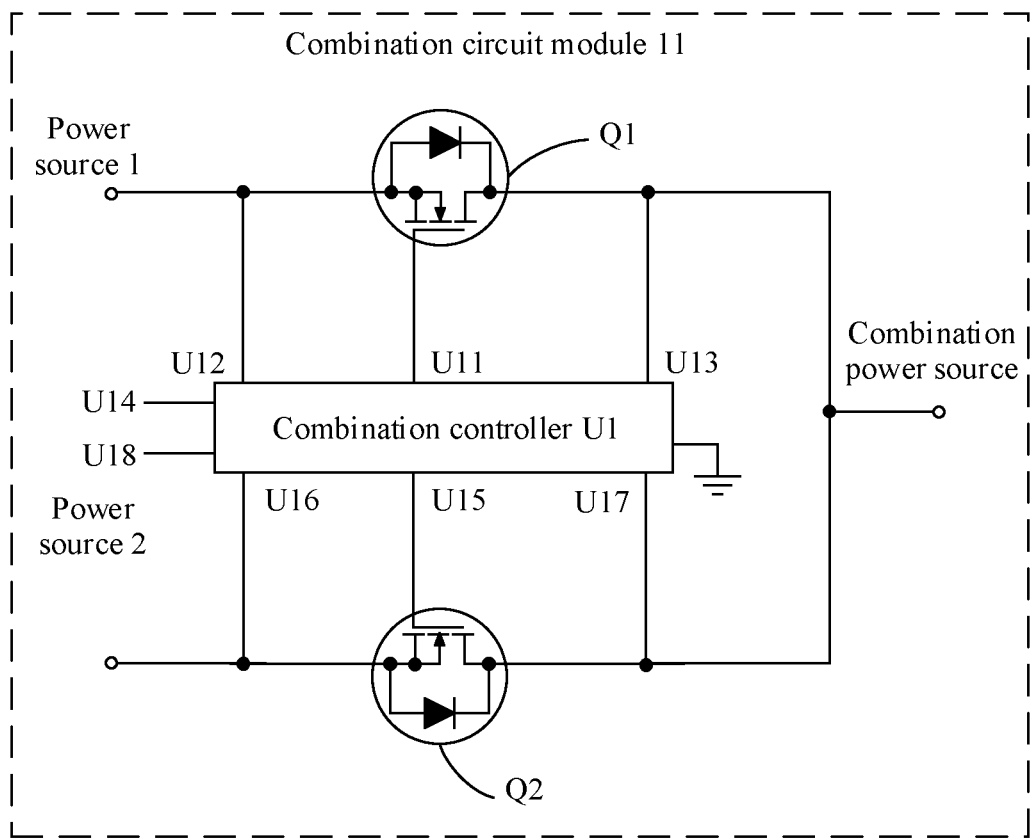
FIG. 6 is a schematic diagram of another combination circuit module according to an embodiment of this disclosure.

Optionally, FIG. 6 shows another combination circuit module 11 according to an embodiment of this disclosure. A difference from the combination circuit module shown in FIG. 5 lies in that only one combination controller is configured in FIG. 6. Both the Q1 and the Q2 in the combination circuit module 11 are N-channel field-effect transistors. In addition, the Q1 and the Q2 share one combination controller U1.

For interconnections between the Q1, a power source 1, and the combination controller U1, reference may be made to the description of the interconnections between the Q1, the power source 1, and the combination controller U1 in the combination circuit module 11 in FIG. 5. In addition, for interconnections between the Q2, a power source 2, and the combination controller U1, reference may be made to the description of the interconnections between the Q2, the power source 2, and the combination controller U2 in the combination circuit module 11 in FIG. 5. Details are not described herein.

It should be noted that an excitation port U11, a port U12, a port U13, and an enable end U14 that are in the combination controller U1 and that are connected to the Q1 are used as a first port group, to control the Q1 to be in an on state or a cut-off state. An excitation port U15, a port U16, a port U17, and an enable end U18 that are in the combination controller U1 and that are connected to the Q2 are used as a second port group, to control the Q2 to be in an on state or a cut-off state.

Figure 7:
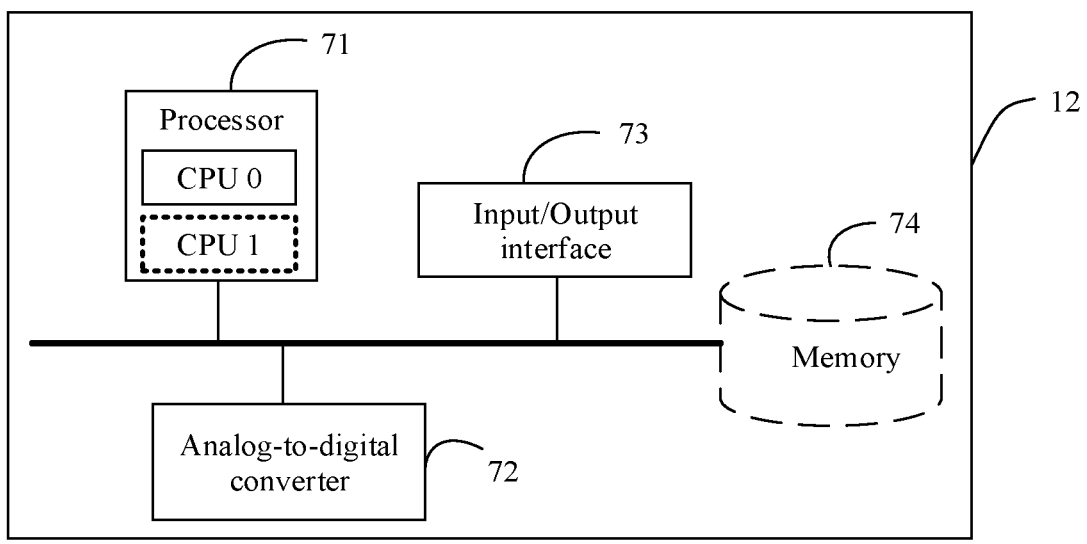
FIG. 7 is a schematic structural diagram of a control module according to an embodiment of this disclosure.

FIG. 7 is a schematic structural diagram of a control module 12 according to an embodiment of this disclosure. In this embodiment of this disclosure, an example where the control module 12 includes the sampling module 13 is used for description. The control module 12 is configured to control a combination circuit module 11 to provide a dual power source to supply power to a load circuit. The control module 12 may be an MCU or an ECU. This is not limited herein.

The control module 12 may include a processor 71, an analog-to-digital converter (ADC) 72 (corresponding to the sampling module in this embodiment of this disclosure), and an input/output interface 73. Optionally, the control module 12 may further be a memory 74. The ADC 72 (equivalent to the sampling module in this embodiment of this disclosure), the input/output interface 73, and the memory 74 may be separately connected to and communicate with the processor 71.

The processor 71 is a control center of the control module 12. It may be a general-purpose central processing unit (CPU), or may be another general-purpose processor, a digital signal processor (DSP), an application-specific integrated circuit (ASIC), a field-programmable gate array (FPGA), or another programmable logic component, a discrete gate or a transistor logic device, a discrete hardware component, or the like. The general-purpose processor may be a microprocessor, any conventional processor, or the like.

In an example, the processor 71 may include one or more CPUs, for example, a CPU 0 and a CPU 1 shown in FIG. 7.

The ADC 72 is configured to collect a first input voltage of a Q1, a second input voltage of a Q2, and a third input voltage of a load circuit in a combination circuit module 11. The ADC 72 further sends the first input voltage, the second input voltage, and the third input voltage that are collected to the processor 71 for diagnostic analysis. The first input voltage is an input side voltage of the Q1, the second input voltage is an input side voltage of the Q2, and the third input voltage is an input voltage of the load circuit. That is, the third input voltage is a voltage at a power source input end of the load circuit.

A quantity of the ADC 72 is related to a quantity of power sources that need to be combined by the combination circuit module 11. If the quantity of power sources that need to be combined by the combination circuit module 11 is m, the quantity of the ADC 72 is m+1. Herein, m is an integer greater than or equal to 1.

For example, as shown in FIG. 8, in a power source combination circuit system shown in FIG. 8, a combination circuit module 11 includes two power sources (a power source 1 and a power source 2) that need to be combined. Therefore, the control module 12 may include three ADCs 72 (an ADC 72_1, an ADC 72_2, and an ADC 72_3). Further, the ADC 72_1 may be connected to a second end Q12 of the Q1 through a port 121. It collects a first input voltage VA at the second end Q12 of the Q1. The ADC 72_2 may be connected to a second end Q22 of the Q2 through a port 122. It collects a second input voltage VB at the second end Q22 of the Q2. The ADC 72_3 may be connected to a power source input end 141 of a load circuit 14 through a port 123. It collects a third input voltage VC of the power source input end 141 of the load circuit 14.

An input/output interface 73 may be a general-purpose input/output interface (GPIO). The input/output interface 73 is configured to send a control signal to the combination circuit module 11, so as to activate or turn off an enable end of a combination controller in the combination circuit module 11. Further, when the enable end of the combination controller in the combination circuit module 11 is activated, the combination controller is in a working state. In this way, the combination controller may input an excitation voltage to a field-effect transistor through an excitation port, so that the field-effect transistor is in an on state. Alternatively, when the enable end of the combination controller in the combination circuit module 11 is turned off, the combination controller is in a non-working state. In this way, the field-effect transistor cannot receive an excitation voltage that is input by the combination controller through an excitation port. That is, the field-effect transistor is in a cut-off state.

The control signal may be a level signal. The control signal may include at least one level signal of a high level signal or a low level signal. For example, the input/output interface 73 may send a high level signal to the enable end of the combination controller to activate the combination controller. The input/output interface 73 may send a low level signal to the enable end of the combination controller to turn off the combination controller. Alternatively, the input/output interface 73 may send a low level signal to the enable end of the combination controller to activate the combination controller. The input/output interface 73 may send a high level signal to the enable end of the combination controller to turn off the combination controller. This is not limited in this embodiment of this disclosure.

A quantity of the input/output interfaces 73 is the same as the quantity of power sources that need to be combined by the combination circuit module 11. If the quantity of power sources that need to be combined by the combination circuit module 11 is m, the quantity of the input/output interfaces 73 is m.

For example, as shown in FIG. 8, the combination circuit module 11 includes the two power sources (the power source 1 and the power source 2) that need to be combined. Therefore, the control module 12 may include two input/output interfaces 73 (a port 124 and a port 125). The port 124 of the control module 12 is connected to an enable end U14 of a combination controller U1. According to an instruction of a processor 71, the port 124 may send a control signal to the enable end U14 of the combination controller U1. The control signal may be used to activate the combination controller U1, so that the Q1 is in an on state. Alternatively, the control signal may be used to turn off the combination controller U1, so that the Q1 is in a cut-off state. Herein, the control signal may include at least one signal of a high level signal or a low level signal. This is not limited.

Similarly, the port 125 of the control module 12 is connected to an enable end U24 of a combination controller U2. According to an instruction of the processor 71, the port 125 may send a control signal to the enable end U24 of the combination controller U2. The control signal may be used to activate the combination controller U2, so that the Q2 is in an on state. Alternatively, the control signal may be used to turn off the combination controller U2, so that the Q2 is in a cut-off state.

It should be noted that the ADC 72 and the input/output interface 73 may be integrated with the processor 71. In this case, a component integrating the ADC 72, the input/output interface 73, and the processor 71 may be referred to as an MCU.

The memory 74 may be a read-only memory (ROM) or another type of static storage device capable of storing static information and instructions, a random-access memory (RAM) or another type of dynamic storage device capable of storing information and instructions, an electrically erasable programmable ROM (EEPROM), a magnetic disk storage medium or another magnetic storage device, or any other medium capable of carrying or storing expected program code in a form of an instruction or data structure and capable of being accessed by a computer, but is not limited thereto.

In a possible implementation, the memory 74 may be independent of the processor 71. The memory 74 may be connected to the processor 71 through a bus, and is configured to store data, instructions, or program code. When the processor 71 invokes and executes the instructions or the program code stored in the memory 74, the processor 71 may implement the power source combination circuit diagnosis method provided in this embodiment of this disclosure.

In another possible implementation, the memory 74 may alternatively be integrated with the processor 71.

It should be noted that the structure shown in FIG. 7 does not constitute a limitation on the control module 12. In addition to the components shown in FIG. 7, the control module 12 may include more or fewer components than those shown in the figure, or combine some components, or have different component arrangements.

In this way, the control module 12 in the power source combination circuit 10 controls conduction of a field-effect transistor in the combination circuit module 11, so as to combine the power source 1 and the power source 2 into one power source and supply power to a load circuit.

Before the power source combination circuit 10 supplies power to a load circuit, an embodiment of this disclosure further provides a power source combination circuit diagnosis method. The diagnosis method is used to diagnose a faulty component in the power source combination circuit 10, and an alarm is sent to a user when a failure is diagnosed.

The following describes the power source combination circuit diagnosis method provided in the embodiment of the present disclosure with reference to the figures.

FIG. 9 is a schematic flowchart of the power source combination circuit diagnosis method according to an embodiment of this disclosure. The method is applied to the power source combination circuit system shown in FIG. 8, and the method may include the following steps.

S101: A control module 12 sends a control signal to a combination circuit module 11, so as to control and obtain a state combination of field-effect transistors in the combination circuit module 11.

Further, after the power source combination circuit system shown in FIG. 8 is powered on, the control module 12 may send a first group of control signals, a second group of control signals, a third group of control signals, and a fourth group of control signals to the combination circuit module 11 through the input/output interface. Herein, the first group of control signals, the second group of control signals, the third group of control signals, and the fourth group of control signals are respectively four groups of control signals sent by the control module 12 to the combination circuit module 11 at different moments. In addition, each group of control signals in the first group of control signals, the second group of control signals, the third group of control signals, and the fourth group of control signals includes a first signal and a second signal. The first signal is used to control an enable end of the combination controller U1 in the combination circuit module 11, and the second signal is used to control an enable end of the combination controller U2 in the combination circuit module 11.

Further, the first signal in the first group of control signals may be used to activate the enable end of the combination controller U1 in the combination circuit module 11, so that the combination controller U1 is in a working state. The second signal in the first group of control signals may be used to activate the enable end of the combination controller U2, so that the combination controller U2 is in a working state. In this way, the combination controller U1 may control the Q1 to be in an on state, and the combination controller U2 may control the Q2 to be in an on state.

The first signal in the second group of control signals may be used to activate the enable end of the combination controller U1 in the combination circuit module 11, so that the combination controller U1 is in a working state. The second signal in the second group of control signals may be used to turn off the enable end of the combination controller U2 in the combination circuit module 11, so that the combination controller U2 is in a non-working state. In this way, the combination controller U1 may control the Q1 to be in an on state, and the combination controller U2 may control the Q2 to be in a cut-off state.

The first signal in the third group of control signals may be used to activate the enable end of the combination controller U2 in the combination circuit module 11, so that the combination controller U2 is in a working state. In this case, the second signal in the third group of control signals may be used to turn off the enable end of the combination controller U1 in the combination circuit module 11, so that the combination controller U1 is in a non-working state. In this way, the combination controller U2 may control the Q2 to be in an on state, and the combination controller U1 may control the Q1 to be in a cut-off state.

The first signal in the fourth group of control signals may be used to turn off the enable end of the combination controller U1 in the combination circuit module 11, so that the combination controller U1 is in a non-working state. The second signal in the fourth group of control signals may be used to turn off the enable end of the combination controller U2 in the combination circuit module 11, so that the combination controller U2 is in a non-working state. In this way, the combination controller U1 may control the Q1 to be in a cut-off state, and the combination controller U2 may control the Q2 to be in a cut-off state.

That is, the first group of control signals may control and obtain a first state combination of the field-effect transistors in the combination circuit module 11: Both the Q1 and the Q2 are in an on state. The second group of control signals may control and obtain a second state combination of the field-effect transistors in the combination circuit module 11: The Q1 is in an on state and the Q2 is in a cut-off state. The third group of control signals may control and obtain a third state combination of the field-effect transistors in the combination circuit module 11: The Q1 is in a cut-off state and the Q2 is in an on state. The fourth group of control signals may control and obtain a fourth state combination of the field-effect transistors in the combination circuit module 11: Both the Q1 and the Q2 are in a cut-off state.

It should be noted that a time sequence is not limited in embodiments of this disclosure for the control module 12 to send the first group of control signals, the second group of control signals, the third group of control signals, and the fourth group of control signals to the combination circuit module 11. For example, the control module 12 may send the first group of control signals, the second group of control signals, the third group of control signals, and the fourth group of control signals to the combination circuit module 11 in sequence. Alternatively, the control module 12 may send the second group of control signals first, and then send the first group of control signals, the third group of control signals, the fourth group of control signals in sequence, or in similar ways.

It may be understood that, in embodiments of this disclosure, a time sequence for the control module 12 to control and obtain a state combination of the field-effect transistors in the combination circuit module 11 is not limited. For example, the control module 12 may control and obtain the first state combination, the second state combination, the third state combination, and the fourth state combination of the field-effect transistors in the combination circuit module 11 in sequence. The control module 12 may alternatively control and obtain the second state combination of the field-effect transistors in the combination circuit module 11 first, and then control and obtain the third state combination, the first state combination, and the fourth state combination in sequence. This is not limited herein.

In response to an operation of the control module 12, statuses of the field-effect transistors in the combination circuit module 11 may be the first state combination, the second state combination, the third state combination, and the fourth state combination respectively.

S102: The control module 12 obtains a first input voltage, a second input voltage, and a third input voltage of the field-effects transistor that are in the combination circuit module 11 and that are in different state combinations.

Further, the control module 12 may collect the first input voltage, the second input voltage, and the third input voltage of the field-effect transistors that are in the combination circuit module 11 and that are in the different state combinations by using a sampling module, so as to obtain the first input voltage, the second input voltage, and the third input voltage of the field-effect transistors that are in the combination circuit module 11 and that are in the different state combinations.

Certainly, if a sampling module is excluded from the control module 12, the sampling module collects the first input voltage, the second input voltage, and the third input voltage of the field-effect transistors that are in the combination circuit module 11 and that are in different state combinations, and sends the collected voltages to the control module 12. By doing so, the control module 12 obtains the first input voltage, the second input voltage, and the third input voltage of the field-effect transistors that are in the combination circuit module 11 and that are in the different state combinations.

Refer to FIG. 8. The first input voltage may be an input side voltage VA of the Q1, the second input voltage may be an input side voltage VB of the Q2, and the third input voltage may be an input voltage VC of the load circuit.

Further, the control module 12 may respectively collect, by using ADCs, a first input voltage VA1, a second input voltage VB1, and a third input voltage VC1 when the state combination of the field-effect transistors in the combination circuit module 11 is the first state combination.

The control module 12 may respectively collect, by using the ADCs, a first input voltage VA2, a second input voltage VB2, and a third input voltage VC2 when the state combination of the field-effect transistors in the combination circuit module 11 is the second state combination.

The control module 12 may respectively collect, by using the ADCs, a first input voltage VA3, a second input voltage VB3, and a third input voltage VC3 when the state combination of the field-effect transistors in the combination circuit module 11 is the third state combination.

The control module 12 may be controlled to respectively collect, by using the ADCs, a first input voltage VA4, a second input voltage VB4, and a third input voltage VC4 when the state combination of the field-effect transistors in the combination circuit module 11 is the fourth state combination.

S103: The control module 12 diagnoses the combination circuit module 11 based on the first input voltage, the second input voltage, the third input voltage, and a preset parameter of the field-effect transistors that are in the combination circuit module 11 and that are in the different state combinations.

The preset parameter may include the following values: a minimum forward voltage drop of an internal body diode of the Q1 (VQ1_D_min), a maximum forward voltage drop of the internal body diode of the Q1 (VQ1_D_max), a minimum forward voltage drop of an internal body diode of the Q2 (VQ2_D_min), and a maximum forward voltage drop of the internal body diode of the Q2 (VQ2_D_max), a maximum voltage difference that is calculated on the basis of a maximum current of the load circuit and a maximum conductive internal direct current resistance of the Q1 and that flows through the Q1 (VQ1_max), and a maximum voltage difference that is calculated on the basis of the maximum current of the load circuit and a maximum conductive internal direct current resistance of the Q2 and that is of the Q2 (VQ2_max).

Further, the control module may diagnose the combination circuit module 11 according to the diagnosis criteria shown in Table 1, and obtain a corresponding diagnosis result.

When a state combination of the field-effect transistors in the combination circuit module 11 is the second state combination, that is, the Q1 is in an on state and the Q2 is in a cut-off state, because a conductive internal resistance is very small, a voltage difference generated by the internal resistance of the Q1 is far less than a voltage drop generated by a body diode inside the Q2. Therefore, when the VA2 is smaller than (VB2−VQ2_D_max), if the VC2 is between (VB2−VQ2_D_max) and (VB2−VQ2_D_min), it indicates that the combination circuit module 11 is normal, if the VC2 is smaller than (VB2−VQ2_D_max), it indicates that the Q2 is abnormal, for example, the VQ2_D_max is excessively large. When the VA2 is greater than or equal to ((VB2−VQ2_D_min)+VQ1_max), if the VC2 is greater than or

TABLE 1

| The State combination of the Field-Effect Transistors in the Combination Circuit Module 11 | Diagnosis Criteria | Diagnosis Result |
| --- | --- | --- |
| The first state combination | VC1 ≥ max ((VA1 − VQ1_max), (VB1 − VQ2_max)) | The combination circuit module 11 is normal. |
| | VC1 < ((VA1 − VQ1_max), (VB1 − VQ2_max)) | The combination circuit module 11 is abnormal. |
| The second state combination | When VA2 < (VB2 − (VQ2_D_max)), (VB2 − VQ2_D_max) < VC2 < (VB2 − VQ2_D_min) | The combination circuit module 11 is normal. |
| | When VA2 < (VB2 − (VQ2_D_max)), VC2 < (VB2 − VQ2_D_max) | The Q2 is abnormal. |
| | When VA2 ≥ ((VB2 − VQ2_D_min) + VQ1_max), VC2 ≥ (VA2 − VQ1_max) | The combination circuit module 11 is normal. |
| | When VA2 ≥ ((VB2 − VQ2_D_min) + VQ1_max), VC2 < (VA2 − VQ1_max) | The Q1 is abnormal, or the U1 is abnormal. |
| The third state combination | When VB3 < (VA3 − (VQ1_D_max)), (VA3 − VQ1_D_max) < VC3 < (VA3 − VQ1_D_min) | The combination circuit module 11 is normal. |
| | When VB3 < (VA3 − (VQ1_D_max)), VC3 < (VA3 − VQ1_D_max) | The Q1 is abnormal. |
| | When VB3 ≥ ((VA3 − VQ1_D_min) + VQ2_max), VC3 > (VB3 − VQ2_max) | The combination circuit module 11 is normal. |
| | When VB3 ≥ ((VA3 − VQ1_D_min) + VQ2_max), VC3 < (VB3 − VQ2_max) | The Q2 is abnormal, or the U2 is abnormal. |
| The fourth state combination | (VA4 − VQ1_D_max) < VC4 < (VA4 − VQ1_D_min) or (VB4 − VQ2_D_max) < VC4 < (VB4 − VQ2_D_min) | The combination circuit module 11 is normal. |
| | Others | The combination circuit module 11 is abnormal. |

The following describes the content in Table 1.

When a state combination of the field-effect transistors in the combination circuit module 11 is the first state combination, that is, both the Q1 and the Q2 are in an on state, the VC1 satisfies the following conditions at the same time: greater than or equal to (VA1−VQ1_max), and greater than or equal to (VB1−VQ2_max). That is, when the VC1 is greater than or equal to the larger one of (VA1−VQ1_max) and (VB1−VQ2_max), it indicates that the combination circuit module 11 is normal. Otherwise, it indicates that the combination circuit module 11 is abnormal.

equal to (VA2−VQ1_max), it indicates that the combination circuit module 11 is normal, otherwise, it indicates that the Q1 or the U1 is abnormal, for example, a conductive impedance of the Q1 is excessively large, or an excitation voltage output by an excitation end of the U1 is lower than the first excitation voltage.

When a state combination of the field-effect transistors in the combination circuit module 11 is the third state combination, that is, the Q1 is in a cut-off state and the Q2 is in an on state, because a conductive internal resistance of the Q2 is very small, a voltage difference generated by the internal resistance of the Q2 is far less than a voltage drop generated by a body diode inside the Q1. Therefore, when the VB3 is smaller than (VA3−VQ1_D_max), if the VC3 is between (VA3−VQ1_D_max) and (VA3−VQ1_D_min), it indicates that the combination circuit module 11 is normal, if the VC3 is smaller than (VA3−VQ1_D_max), it indicates that the Q1 is abnormal, for example, VQ1_D_max is excessively large. When the VB3 is greater than or equal to ((VA3−VQ1_D_min)+VQ2_max), if the VC is greater than or equal to (VB3−VQ2_max), it indicates that the combination circuit module 11 is normal, otherwise, it indicates that the Q2 is abnormal or the U2 is abnormal, for example, a conductive impedance of the Q2 is excessively large, or an excitation voltage output by an excitation end of the U2 is lower than the second excitation voltage.

When a state combination of the field-effect transistors in the combination circuit module 11 is the fourth state combination, that is, both the Q1 and the Q2 are in a cut-off state, the VC4 may be within a normal voltage drop range of body diodes inside the Q1 and the Q2. Therefore, when the VC4 is between (VA4−VQ1_D_max) and (VA4−VQ1_D_min), or, when the VC4 is between (VB4−VQ2_D_max) and (VB4−VQ2_D_min), it indicates that the combination circuit module 11 is normal. Otherwise, it indicates that the combination circuit module 11 is abnormal.

For ease of the following description, in the embodiments of this disclosure, "the four state combinations of the field-effect transistors in the combination circuit module 11" are referred to as "the four state combinations."

It can be seen that, based on first input voltages, second input voltages, and third input voltages that are collected in the four state combinations and according to the diagnosis criteria, the control module 12 diagnoses the combination circuit module 11. If the diagnosis result is normal, it indicates that the combination circuit module 11 is normal. In this case, the control module 12 may continuously control both the Q1 and the Q2 to be in an on state, so as to supply power to the load circuit normally. When a diagnosis result of at least one state combination among the four state combinations is abnormal, the control module 12 may control both the Q1 and the Q2 to be in a cut-off state, and send alarm information to a user interaction module to remind a user that the power source combination circuit system is abnormal.

When the control module 12 diagnoses the combination circuit module 11 based on the first input voltages, the second input voltages, and the third input voltages that are collected in the four state combinations, any one of the following implementations may be adopted.

In a first possible implementation, the four state combinations are state combinations of the field-effect transistors in the combination circuit module 11 at different moments. Therefore, when the control module 12 may control and obtain one state combination of the field-effect transistors in the combination circuit module 11, that is, based on a first input voltage, a second input voltage, and a third input voltage that are collected in this state combination, the control module 12 may perform a diagnosis on the combination circuit module 11 and obtain a diagnosis result. In this way, the control module may perform four diagnoses based on a first input voltage, a second input voltage, and a third input voltage that are collected each time, to obtain four diagnosis results. Then, the control module 12 determines whether the combination circuit module 11 is normal based on the four diagnosis results.

Optionally, when a diagnosis result obtained for the first time is "abnormal", the control module 12 may stop diagnosing the combination circuit module 11, control both the Q1 and the Q2 to be in a cut-off state, and send alarm information to the user interaction module to remind a user that the power source combination circuit system is abnormal. In this way, if the diagnosis result prompting "abnormal" is not a diagnosis result of the fourth diagnosis, the quantity of times of collecting a first input voltage, a second input voltage, and a third input voltage of the combination circuit module 11 by the control module 12 is reduced, and the quantity of times of diagnosing the combination circuit module 11 is reduced, thereby improving efficiency of the power source combination circuit diagnosis method provided in the embodiments of this disclosure.

In a second possible implementation, the control module 12 may alternatively first collect the first input voltages, the second input voltages, and the third input voltages in the four state combinations, and then diagnose the combination circuit module 11 according to the criteria in Table 1 to determine whether the combination circuit module 11 is normal.

The control module 12 detects a first input voltage, a second input voltage, and a third input voltage in different state combinations of the Q1 corresponding to a first power source and the Q2 corresponding to a second power source, and determines whether values of the first input voltage, the second input voltage, and the third input voltage are within a theoretical range in each state combination, so as to diagnose a failure of a component in the combination circuit module 11.

In conclusion, the embodiments of this disclosure provide a power source combination circuit diagnosis method that may be used to diagnose a power source combination circuit before the power source combination circuit supplies power to a load circuit. When a component in the power source combination circuit is diagnosed as abnormal, power supply to the load circuit may be stopped. By doing so, it is ensured that no faults occur in the load circuit during a power supply process due to the abnormality of the power source combination circuit, thereby improving security of the load circuit. In addition, the embodiments of this disclosure further provide a power source combination circuit and a system. The power source combination circuit uses a field-effect transistor as a key component. Because a voltage drop of a field-effect transistor is extremely small (in millivolts) when the field-effect transistor is in an on state, even if a current flowing through the field-effect transistor is relatively large, the field-effect transistor may not generate excessive heat loss. In this way, the power source combination circuit provided in the embodiments of this disclosure may supply power to two or more power sources for a low-voltage load circuit with relatively high power.

The foregoing mainly describes the solutions provided in embodiments of this disclosure from the perspective of the methods. To implement the foregoing functions, corresponding hardware structures and/or software modules for performing the functions are included. A person skilled in the art should easily be aware that, in combination with units and algorithm steps of the examples described in embodiments disclosed in this specification, this disclosure may be implemented by hardware or a combination of hardware and computer software. Whether a function is performed by hardware or hardware driven by computer software depends on particular applications and design constraints of the technical solutions. A person skilled in the art may use different methods to implement the described functions for each particular application, but it should not be considered that the implementation goes beyond the scope of this disclosure.

In this embodiment of this disclosure, the power source combination circuit diagnosis apparatus may be divided into function modules based on the foregoing method examples. For example, each function module may be obtained through division based on each corresponding function, or two or more functions may be integrated into one processing module. The integrated module may be implemented in a form of hardware, or may be implemented in a form of a software functional module. It should be noted that in embodiments of this disclosure, division into the modules is an example and is merely logical function division, and may be other division in an actual implementation.

Figure 10:
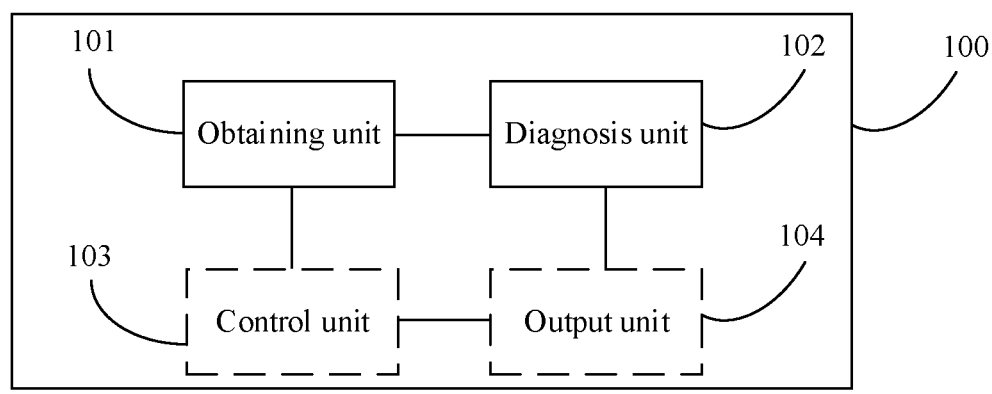
FIG. 10 is a schematic structural diagram of a power source combination circuit diagnosis apparatus according to an embodiment of this disclosure.

FIG. 10 is a schematic structural diagram of a power source combination circuit diagnosis apparatus 100 according to an embodiment of this disclosure. The diagnosis apparatus 100 is used in a power source combination circuit in a power source combination circuit system, and the power source combination circuit further includes a combination circuit module. The combination circuit module contains a first power source, a first field-effect transistor, a second power source, and a second field-effect transistor. Herein, the first power source is connected to an input end of the first field-effect transistor, the second power source is connected to an input end of the second field-effect transistor, and both an output end of the first field-effect transistor and an output end of the second field-effect transistor are connected to a power source port of a load circuit. The diagnosis apparatus 100 is configured to control the combination circuit module to supply power to the load circuit.

The diagnosing apparatus 100 is configured to diagnose the power source combination circuit. The diagnosing apparatus 100 is further used to perform the foregoing power source combination circuit diagnosis method, for example, it is used to perform the method shown in FIG. 9. The diagnosis apparatus 100 may include an obtaining unit 101 and a diagnosis unit 102.

The obtaining unit 101 is configured to obtain a first input voltage, a second input voltage, and a third input voltage. The first input voltage is an input side voltage of the first field-effect transistor, the second input voltage is an input side voltage of the second field-effect transistor, and the third input voltage is a voltage at a power source end of the load circuit. The diagnosis unit 102 is configured to diagnose, based on the obtained voltages, whether the combination circuit module is abnormal.

For example, with reference to FIG. 9, the obtaining unit 101 may be used to perform the S102, and the diagnosis unit 102 may be used to perform the S103.

Optionally, the diagnosis unit 102 is further configured to diagnose, based on the obtained voltage and a preset parameter, whether the combination circuit module is abnormal. In this case, the preset parameter includes at least one of the following values: a minimum forward voltage drop value of an internal body diode of the first field-effect transistor, a maximum forward voltage drop value of the internal body diode of the first field-effect transistor, a minimum forward voltage drop value of an internal body diode of the second field-effect transistor, a maximum forward voltage drop value of the internal body diode of the second field-effect transistor, a maximum voltage difference value that is calculated on the basis of a maximum current of the load circuit and that is of the first field-effect transistor, or a maximum voltage difference value that is calculated on the basis of the maximum current of the load circuit and that is of the second field-effect transistor.

For example, with reference to FIG. 9, the diagnosis unit 102 may be used to perform the S103.

Optionally, the power source combination circuit further includes a sampling module. The sampling module is connected to the input end of the first field-effect transistor, the input end of the second field-effect transistor, and a power source input end of the load circuit. The sampling module is configured to collect the first input voltage, the second input voltage, and the third input voltage. The obtaining unit 101 is further configured to obtain the first input voltage, the second input voltage, and the third input voltage that are collected by the sampling module.

In an example, with reference to FIG. 9, the obtaining unit 101 may be configured to perform the S102.

Optionally, the diagnosis apparatus 100 further includes a control unit 103 that is configured to control statuses of the first field-effect transistor and the second field-effect transistor. The statuses include an on state and a cut-off state. The obtaining unit 101 is further configured to obtain a first input voltage, a second input voltage, and a third input voltage when the first field-effect transistor and the second field-effect transistor are in a target state combination and that are collected by the sampling module. The target state combination includes any one of the following combinations: both the first field-effect transistor and the second field-effect transistor are in an on state, both the first field-effect transistor and the second field-effect transistor are in a cut-off state, the first field-effect transistor is in an on state, and the second field-effect transistor is in a cut-off state, and the first field-effect transistor is in a cut-off state, and the second field-effect transistor is in an on state.

For example, with reference to FIG. 9, the control unit 103 may be configured to perform the S101, and the obtaining unit 101 may be configured to perform the S102.

Optionally, the combination circuit module further includes a first combination controller and a second combination controller. The first combination controller is connected to an excitation end of the first field-effect transistor, and the second combination controller is connected to an excitation end of the second field-effect transistor. The control unit 103 is further configured to control the first combination controller to output a first excitation voltage. The first excitation voltage is used to control the first field-effect transistor to be in an on state. The control unit 103 is further configured to control the second combination controller to output a second excitation voltage. The second excitation voltage is used to control the second field-effect transistor to be in an on state.

For example, with reference to FIG. 9, the control unit 103 may be configured to perform the S101.

Optionally, if the diagnosis result of the combination circuit module is normal, the control unit 103 is further configured to control both the first field-effect transistor and the second field-effect transistor to be in an on state, so as to control the combination circuit module to supply power to the load circuit.

The diagnosis apparatus 100 further includes an output unit 104 that is configured to output an alarm signal if the diagnosis result of the combination circuit module is abnormal.

Optionally, power of the diagnosis apparatus 100 is less than or equal to a preset threshold, and power of the load circuit is greater than or equal to the preset threshold.

For specific descriptions of the optional manners, refer to the method embodiments. Details are not described herein again. In addition, for any explanation of the diagnosis apparatus 100 provided above and descriptions of beneficial effects, refer to the foregoing corresponding method embodiments. Details are not described herein again.

For example, with reference to FIG. 7, functions implemented by the obtaining unit 101, the diagnosis unit 102, and the control unit 103 in the diagnosis apparatus 100 may be implemented by the processor 71 in FIG. 7 by executing the program instruction in the memory 74. A function implemented by an output unit 104 may be implemented by using the input/output interface 73 in FIG. 7.

Another embodiment of this disclosure further provides a computer-readable storage medium. The computer-readable storage medium stores an instruction. When the instruction runs on a power source combination circuit diagnosis apparatus, the power source combination circuit diagnosis apparatus performs the steps performed by the power source combination circuit diagnosis apparatus in the method procedure shown in the foregoing method embodiment.

In some embodiments, the disclosed method may be implemented as computer program instructions encoded in a machine-readable format on a computer-readable storage medium or encoded on another non-transitory medium or product.

An embodiment of this disclosure further provides a proper power source circuit system. The system includes the power source combination circuit shown in FIG. 1 or FIG. 2. The power source combination circuit is used to implement the foregoing diagnosis method of the power source combination diagnosis apparatus. For brevity, details are not described herein again.

All or some of the foregoing embodiments may be implemented by using software, hardware, firmware, or any combination thereof. When a software program is used to implement the embodiments, all or a part of the embodiments may be implemented in a form of a computer program product. The computer program product includes one or more computer instructions. When the computer-executable instructions are loaded and executed on a computer, the procedures or functions according to embodiments of this disclosure are all or partially generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DIGITAL VERSATILE DISC (DVD)), a semiconductor medium (for example, a solid-state drive (SSD)), or the like.

The foregoing descriptions are merely specific implementations of the present disclosure, but are not intended to limit the protection scope of the present disclosure. Any variation or replacement readily figured out by persons skilled in the art within the technical scope disclosed in the present disclosure shall fall within the protection scope of the present disclosure. Therefore, the protection scope of the present disclosure shall be subject to the protection scope of the claims.

What is claimed is:

1. A power source combination circuit comprising:
   a combination circuit comprising:
      a first power source;
      a first field-effect transistor comprising:
         a first input end coupled to the first power source; and
         a first output end coupled to a power source input end of a load circuit;
      a second power source; and
      a second field-effect transistor comprising:
         a second input end coupled to the second power source; and
         a second output end coupled to the power source input end of the load circuit; and
   a controller coupled to the combination circuit configured to:
      control the combination circuit to supply power to the load circuit;
      obtain a first input voltage, a second input voltage, and a third input voltage;
      obtain, based on a maximum current of the load circuit that is from the first field-effect transistor, or that is from the second field-effect transistor, a maximum voltage difference value; and
      diagnose, based on the first input voltage, the second input voltage, the third input voltage, and the maximum voltage difference value, whether the combination circuit is abnormal.

2. The power source combination circuit of claim 1, further comprising a sampling circuit coupled to the first input end and the second input end and configured to:
   collect the first input voltage, the second input voltage, and the third input voltage, and
   wherein the controller is further configured to further obtain the first input voltage, the second input voltage, and the third input voltage from the sampling circuit.

3. The power source combination circuit of claim 2, wherein the controller is further configured to:
   control statuses of the first field-effect transistor and the second field-effect transistor, wherein the statuses comprise an on state and a cut-off state; and
   further obtain the first input voltage, the second input voltage, and the third input voltage from the sampling circuit when the first field-effect transistor and the second field effect transistor are in a target state combination, wherein the target state combination comprises any one of the following combinations:
      the first field-effect transistor and the second field-effect transistor are both in the on state;
      the first field-effect transistor and the second field-effect transistor are both in the cut-off state;
      the first field-effect transistor is in the on state and the second field-effect transistor is in the cut-off state; or
      the first field-effect transistor is in the cut-off state and the second field-effect transistor is in the on state.

4. The power source combination circuit of claim 3, wherein the first field-effect transistor further comprises a first excitation end, wherein the second field-effect transistor further comprises a second excitation end, and wherein the combination circuit further comprises:
   a first combination controller coupled to the first excitation end; and a second combination controller coupled to the second excitation end, and wherein the controller is further configured to:
control the first combination controller to output a first excitation voltage to control the first field-effect transistor to be in the on state; and
control the second combination controller to output a second excitation voltage to control the second field-effect transistor to be in the on state.

5. The power source combination circuit of claim 3, wherein the controller is further configured to:
control, when the combination circuit is normal, both the first field-effect transistor and the second field-effect transistor to be in the on state to control the combination circuit to supply power to the load circuit; or
output an alarm signal when the combination circuit is abnormal.

6. The power source combination circuit of claim 1, wherein a first power of the controller is less than or equal to a preset threshold, and wherein a second power of the load circuit is greater than or equal to the preset threshold.

7. A method comprising:
controlling, using a controller, a combination circuit to supply power to a load circuit;
obtaining, using the controller, a first input voltage, a second input voltage, and a third input voltage, wherein the first input voltage is an input side voltage of a first field-effect transistor, the second input voltage is an input side voltage of a second field-effect transistor, and the third input voltage is a voltage at a power source input end of the load circuit;
obtaining, based on a maximum current of the load circuit that is from the first field-effect transistor, or that is from the second field-effect transistor, a maximum voltage difference value; and
diagnosing, using the controller and based on the first input voltage, the second input voltage, the third input voltage, and the maximum voltage difference value, whether the combination circuit is abnormal.

8. The method of claim 7, further comprising:
collecting, using a sampling circuit coupled to the first input end, the second input end, and the power source input end, the first input voltage, the second input voltage, and the third input voltage; and
obtaining, using the controller, the first input voltage, the second input voltage, and the third input voltage from the sampling circuit.

9. The method of claim 8, further comprising:
controlling, using the controller, statuses of the first field-effect transistor and the second field-effect transistor, wherein the statuses comprise an on state and a cut-off state; and
obtaining, using the controller, the first input voltage, the second input voltage, and the third input voltage from the sampling circuit when the first field-effect transistor and the second field-effect transistor are in a target state combination, wherein the target state combination comprises any one of the following combinations:
the first field-effect transistor and the second field-effect transistor are both in the on state;
the first field-effect transistor and the second field-effect transistor are both in the cut-off state;
the first field-effect transistor is in the on state and the second field-effect transistor is in the cut-off state; or
the first field-effect transistor is in the cut-off state and the second field-effect transistor is in the on state.

10. The method of claim 9, further comprising:
controlling, using the controller, a first combination controller of the combination circuit that coupled to a first excitation end of the first field-effect transistor to output a first excitation voltage to control the first field-effect transistor to be in the on state; and
controlling, using the controller, a second combination controller of the combination circuit that coupled to a second excitation end of the second field-effect transistor to output a second excitation voltage to control the second field-effect transistor to be in the on state.

11. The method of claim 9, further comprising:
controlling, using the controller, when the combination circuit is normal, both the first field-effect transistor and the second field-effect transistor to be in the on state to control the combination circuit to supply power to the load circuit; and
outputting, using the controller, an alarm signal when the combination circuit is abnormal.

12. The method of claim 11, wherein the alarm signal comprises a prompt.

13. The method of claim 7, wherein a first power of the controller is less than or equal to a preset threshold, and wherein a second power of the load circuit is greater than or equal to the preset threshold.

14. The method of claim 7, wherein the controller stops supplying of power to the load circuit when a component of the combination circuit is diagnosed as abnormal.

15. A system comprising:
a load circuit comprising a power source input end;
a power source combination circuit coupled to the load circuit and configured to supply power to the load circuit, wherein the power source combination circuit comprises:
a combination circuit comprising:
a first power source;
a first field-effect transistor comprising:
a first input end coupled to the first power source; and
a first output end coupled to the power source input end;
a second power source; and
a second field-effect transistor comprising:
a second input end coupled to the second power source; and
a second output end coupled to the power source input end; and
a controller coupled to the combination circuit configured to:
control the combination circuit to supply power to the load circuit;
obtain a first input voltage, a second input voltage, and a third input voltage;
obtain, based on a maximum current of the load circuit that is from the first field-effect transistor, or that is from the second field-effect transistor, a maximum voltage difference value; and
diagnose, based on the first input voltage, the second input voltage, the third input voltage, and the maximum voltage difference value, whether the combination circuit is abnormal;
wherein the first input voltage is an input side voltage of the first field-effect transistor, the second input voltage is an input side voltage of the second field-effect transistor, and the third input voltage is a voltage at the power source input end of the load circuit.

16. The system of claim 15, wherein the power source combination circuit further comprises a sampling circuit coupled to the first input end, the second input end, and the power source input end and configured to:
collect the first input voltage, the second input voltage, and the third input voltage, and wherein the controller is further configured to further obtain the first input voltage, the second input voltage, and the third input voltage from the sampling circuit.

17. The system of claim 16, wherein the controller is further configured to:
control statuses of the first field-effect transistor and the second field-effect transistor, wherein the statuses comprise an on state and a cut-off state; and
further obtain the first input voltage, the second input voltage, and the third input voltage from the sampling circuit when the first field-effect transistor and the second field effect transistor are in a target state combination, wherein the target state combination comprises any one of the following combinations:
the first field-effect transistor and the second field-effect transistor are both in the on state;
the first field-effect transistor and the second field-effect transistor are both in the cut-off state;
the first field-effect transistor is in the on state and the second field-effect transistor is in the cut-off state; or
the first field-effect transistor is in the cut-off state and the second field-effect transistor is in the on state.

18. The system of claim 17, wherein the first field-effect transistor further comprises a first excitation end, wherein the second field-effect transistor further comprises a second excitation end, and wherein the combination circuit further comprises:
a first combination controller coupled to the first excitation end; and
a second combination controller coupled to the second excitation end, and,
wherein the controller is further configured to:
control the first combination controller to output a first excitation voltage to control the first field-effect transistor to be in the on state; and
control the second combination controller to output a second excitation voltage to control the second field-effect transistor to be in the on state.

19. The system of claim 18, wherein the controller is further configured to:
control, when the combination circuit is normal, both the first field-effect transistor and the second field-effect transistor to be in the on state to control the combination circuit to supply power to the load circuit; or
output an alarm signal when the combination circuit is abnormal.

20. The system of claim 15, wherein a first power of the controller is less than or equal to a preset threshold, and wherein a second power of the load circuit is greater than or equal to the preset threshold.

* * * * *